(12) United States Patent
Cao et al.

(10) Patent No.: US 10,396,130 B2
(45) Date of Patent: Aug. 27, 2019

(54) DISPLAY SUBSTRATE INCLUDING SUB-ELECTRODES HAVING TRAPEZIUM SHAPE AND METHOD FOR MANUFACTURING THE SAME

(71) Applicant: BOE TECHNOLOGY GROUP CO., LTD., Beijing (CN)

(72) Inventors: Kun Cao, Beijing (CN); Zhongyuan Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/715,125

(22) Filed: Sep. 25, 2017

(65) Prior Publication Data

US 2018/0151635 A1  May 31, 2018

(30) Foreign Application Priority Data

Nov. 29, 2016 (CN) .......................... 2016 1 1071286

(51) Int. Cl.
*H01L 29/08* (2006.01)
*H01L 27/32* (2006.01)
(Continued)

(52) U.S. Cl.
CPC ...... *H01L 27/3218* (2013.01); *H01L 27/3216* (2013.01); *H01L 27/3246* (2013.01);
(Continued)

(58) Field of Classification Search
None
See application file for complete search history.

(56) References Cited

U.S. PATENT DOCUMENTS

2005/0068477 A1   3/2005   Shin et al.
2014/0184977 A1   7/2014   Uehara et al.
(Continued)

FOREIGN PATENT DOCUMENTS

CN   1870277 A    11/2006
CN   105404038 A   3/2016
CN   205355055 U   6/2016

OTHER PUBLICATIONS

First Chinese Office Action dated Aug. 28, 2018, for corresponding Chinese Application No. 201611071286.8.

*Primary Examiner* — Matthew E. Gordon
(74) *Attorney, Agent, or Firm* — Kinney & Lange, P.A.

(57) ABSTRACT

A method for manufacturing a display substrate is provided. The display substrate comprises a first electrode and a second electrode on a base substrate, the display substrate comprises a plurality of sub-pixels, the first electrode comprises a plurality of sub-electrodes corresponding to the plurality of sub-pixels respectively, when a first line extending in a first direction moves in a second direction within an area of each of the sub-electrodes, a distance between two crossing points of the first line and the sub-electrode changes, the first direction being perpendicular to the second direction. The method includes: forming an opaque pixel definition layer on the base substrate on which the plurality of sub-electrodes has been formed, wherein the pixel definition layer comprises light-transmissible openings corresponding to the sub-electrodes respectively, and a location of the pixel definition layer on the display substrate is controlled.

14 Claims, 2 Drawing Sheets

(51) Int. Cl.
    *H01L 51/52*     (2006.01)
    *H01L 51/56*     (2006.01)

(52) U.S. Cl.
    CPC .......... *H01L 51/5284* (2013.01); *H01L 51/56* (2013.01); *H01L 2227/323* (2013.01)

(56) References Cited

U.S. PATENT DOCUMENTS

| | | | |
|---|---|---|---|
| 2015/0311261 A1* | 10/2015 | Choi | H01L 27/322 257/40 |
| 2016/0260792 A1* | 9/2016 | Kim | H01L 51/5209 |
| 2017/0338292 A1* | 11/2017 | Choi | H01L 27/3216 |
| 2018/0088260 A1 | 3/2018 | Jin et al. | |

* cited by examiner

DISPLAY SUBSTRATE INCLUDING SUB-ELECTRODES HAVING TRAPEZIUM SHAPE AND METHOD FOR MANUFACTURING THE SAME

CROSS-REFERENCE TO RELATED APPLICATION

The present application claims priority of the Chinese patent application No. 201611071286.8 filed on Nov. 29, 2016, which is incorporated herein by reference in its entirety.

TECHNICAL FIELD

The present disclosure relates to display technologies, and in particular to a display substrate, a method for manufacturing the display substrate, and a display device.

BACKGROUND

A display structure in related art includes sub-pixels of three basic colors, namely red, green, and blue, and because service lives of red, green, and blue sub-pixels differ from each other, a display substrate usually needs to be corrected by color compensation.

Accordingly, the color compensation may be implemented by adjusting effective light-emitting areas of the red, green, and blue sub-pixels, so as to ensure a display quality of the display device.

However, in the related art, the red, green, and blue sub-pixels are same in structure, and are difficult to be changed upon having been manufactured, and therefore the color compensation cannot be implemented by adjusting display areas of the red, green, and blue sub-pixels in the related art.

SUMMARY

An object of the present disclosure is to provide a method for manufacturing a display substrate, the display substrate and a display device, so as to adjust the effective light-emitting area of each of sub-pixels in a flexible manner.

In one aspect, the present disclosure provides in some embodiments a method for manufacturing a display substrate, wherein the display substrate includes a first electrode and a second electrode formed on a base substrate, the display substrate is driven to display an image by an electric field generated between the first and second electrodes, and the display substrate includes a plurality of sub-pixels, the first electrode includes a plurality of sub-electrodes corresponding to the plurality of sub-pixels respectively. In the case that a first line extending in a first direction moves in a second direction within an area of each of the sub-electrodes, a distance between two crossing points of the first line and the sub-electrode changes. The first direction is perpendicular to the second direction. The method includes: determining a predetermined requirement of an effective light-emitting area of each of the sub-pixels; and forming a pixel definition layer on the base substrate on which the plurality of sub-electrodes has been formed, wherein the pixel definition layer is made of an opaque material, and includes light-transmissible openings corresponding to the sub-electrodes respectively, a location of the pixel definition layer on the display substrate is controlled in the second direction, to enable that an overlapping area between an orthogonal projection of each of the openings on the base substrate and an orthogonal projection of a sub-electrode corresponding to the opening on the base substrate is within a predetermined range, and the overlapping area is the effective light-emitting area of the sub-pixel corresponding to the sub-electrode, to enable the effective light-emitting area of the sub-pixel to satisfy the predetermined requirement.

In addition, the sub-pixels are divided into groups of different colors; each of sub-electrodes corresponding to the sub-pixels in one of the groups is of a shape different from a shape of each of sub-electrodes corresponding to the sub-pixels in any other one of the groups; and the effective light-emitting area of each of the sub-pixels in one of the groups is of a predetermined requirement different from a predetermined requirement of each of the sub-pixels in any other one of the groups.

In addition, the groups include a group of red sub-pixels, a group of green sub-pixels, and a group of blue sub-pixels.

In addition, the determining the predetermined requirement of the effective light-emitting area of each of the sub-pixels includes: determining a ratio of the effective light-emitting area of each of the sub-pixels in one of the groups to the effective light-emitting area of each of the sub-pixels in any other one of the groups by a color compensation algorithm.

In addition, the first direction is a row direction of the display substrate, and the second direction is a column direction of the display substrate; or the first direction is the column direction of the display substrate, and the second direction is the row direction of the display substrate.

In another aspect, the present disclosure provides in some embodiments a display substrate including a first electrode and a second electrode formed on a base substrate, the display substrate is driven to display an image by an electric field generated between the first and second electrodes, the display substrate includes a plurality of sub-pixels, the first electrode includes a plurality of sub-electrodes corresponding to the plurality of sub-pixels respectively. The display substrate further including: a pixel definition layer arranged on the base substrate on which the plurality of sub-electrodes has been formed, wherein the pixel definition layer is made of an opaque material, and includes light-transmissible openings corresponding to the sub-electrodes respectively, and an overlapping area between an orthogonal projection of each of the openings on the base substrate and an orthogonal projection of a sub-electrode corresponding to the opening on the base substrate is within a predetermined range. In the case that a first line extending in a first direction moves in a second direction within an area of each of the sub-electrodes, a distance between two crossing points of the first line and the sub-electrode changes. The first direction is perpendicular to the second direction, and the overlapping area is the effective light-emitting area of the sub-pixel corresponding to the sub-electrode.

In addition, the sub-pixels are divided into groups of different colors; each of sub-electrodes corresponding to the sub-pixels in one of the groups is of a shape different from a shape of each of sub-electrodes corresponding to the sub-pixels in any other one of the groups; and the effective light-emitting area of each of the sub-pixels in one of the groups is of a predetermined requirement different from a predetermined requirement of each of the sub-pixels in any other one of the groups.

In addition, the groups include a group of red sub-pixels, a group of green sub-pixels, and a group of blue sub-pixels.

In addition, the openings of the pixel definition layer are of an identical shape.

In addition, each of the openings is of a rectangle, and each of two opposite sides of the rectangle is parallel to the first direction; and the sub-pixels are of trapeziums, and each of two parallel sides of each of the trapeziums is parallel to the first direction.

In addition, the first direction is a row direction of the display substrate, and the second direction is a column direction of the display substrate; or the first direction is the column direction of the display substrate, and the second direction is the row direction of the display substrate.

In yet another aspect, the present disclosure provides in some embodiments a display device including the aforementioned display substrate.

BRIEF DESCRIPTION OF THE DRAWINGS

In order to illustrate the technical solutions of the present disclosure in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationships, and when an absolute position of the object is changed, the relative position relationship will be changed too.

The present disclosure provides a solution, so as to adjust effective light-emitting areas of sub-pixels in a flexible manner.

In one aspect, the present disclosure provides a method for manufacturing a display substrate, the display substrate includes a first electrode and a second electrode formed on a base substrate, the display substrate is driven to display an image by an electric field generated between the first and second electrodes, the display substrate includes a plurality of sub-pixels, and the first electrode includes a plurality of sub-electrodes corresponding to the plurality of sub-pixels respectively.

Figure 1:
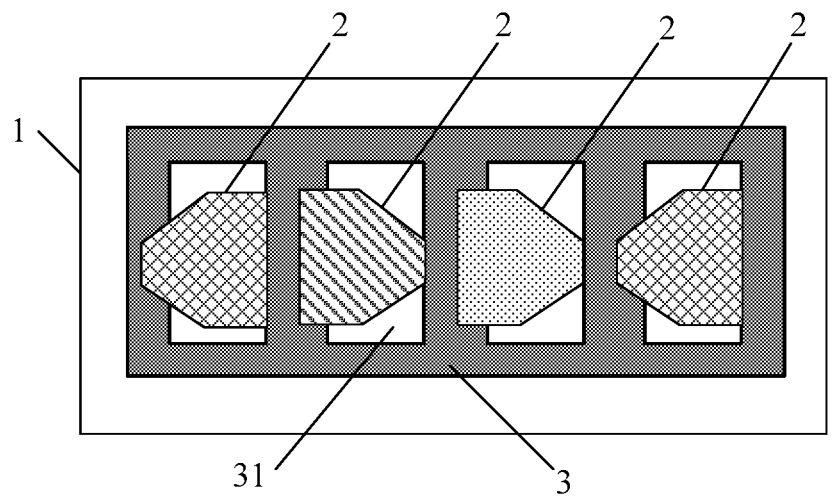
FIG. 1 is a schematic view showing a display substrate according to an embodiment of the present disclosure.

As shown in FIG. 1, the method includes: forming a pixel definition layer 3 on the base substrate 1 on which the plurality of sub-electrodes 2 has been formed, wherein the pixel definition layer 3 is made of an opaque material, and includes light-transmissible openings corresponding to the sub-electrodes 1 respectively, a location of the pixel definition layer 3 on the display substrate is controlled in the second direction, to enable that an overlapping area between an orthogonal projection of each of the openings 31 on the base substrate 1 and an orthogonal projection of a sub-electrode 2 corresponding to the opening 31 on the base substrate 1 is within a predetermined range, and the overlapping area is the effective light-emitting area of the sub-pixel corresponding to the sub-electrode, to enable the effective light-emitting area of the sub-pixel to satisfy the predetermined requirement.

According to this embodiment, each sub-pixel may emit light only through an area of an opening corresponding to the sub-pixel in the pixel definition layer; in other words, the overlapping area between an orthogonal projection of the sub-pixel on the base substrate and an orthogonal projection of the opening on the base substrate is the effective light-emitting area of the sub-pixel. In this embodiment, through adjusting a location of the pixel definition layer on the base substrate, it may adjust the overlapping area between an orthogonal projection of each of the openings on the base substrate and an orthogonal projection of a sub-electrode corresponding to the opening on the base substrate, and thereby adjust the effective light-emitting area of each sub-pixel, such that the color compensation may be controlled in a flexible manner. Because the color compensation may be used to optimize display quality of the display device, the above solution is of a high value.

In particular, in this embodiment, the sub-pixels are divided into groups of different colors; each of the sub-electrodes corresponding to the sub-pixels in one of the groups is of a shape different from a shape of each of the sub-electrodes corresponding to the sub-pixels in any other one of the groups; and the effective light-emitting area of each of the sub-pixels in one of the groups is of a predetermined requirement different from a predetermined requirement of each of the sub-pixels in any other one of the groups.

With further reference to FIG. 1, and for example, the leftmost sub-electrode 2 corresponds to a red color sub-pixel, and the second left electrode 2 corresponds to a green color sub-pixel. As can be seen from FIG. 1, the sub-electrode 2 corresponding to the red color sub-pixel differs in shape from the sub-electrode 2 corresponding to the green color sub-pixel. In the case that the openings of the pixel definition layer are same in shape and size, since an overlapping area between an orthogonal projection of the sub-electrode on the base substrate and an orthogonal projection of the opening corresponding to the sub-electrode on the base substrate is equal to the effective light-emitting area of the sub-pixel, the effective light-emitting areas of the red and green sub-pixels may be adjusted by controlling the location of the pixel definition layer in the row direction during a formation of the pixel definition layer, and a ratio of the effective light-emitting area of the red sub-pixel to the effective light-emitting area of the green sub-pixel may be adjusted. Accordingly, in this embodiment, the effective light-emitting areas of sub-pixels of different colors may be controlled.

In the following, the adjustment of the effective light-emitting areas of the sub-pixels of different colors will be described in further details in an embodiment.

For example, the display substrate includes sub-pixels of three colors, namely red, green, and blue. Prior to manufacturing the display substrate, the ratio of the effective light-emitting areas of the green sub-pixel, the red sub-pixel, and the blue sub-pixel may be determined by a color compensation algorithm.

Figure 2:
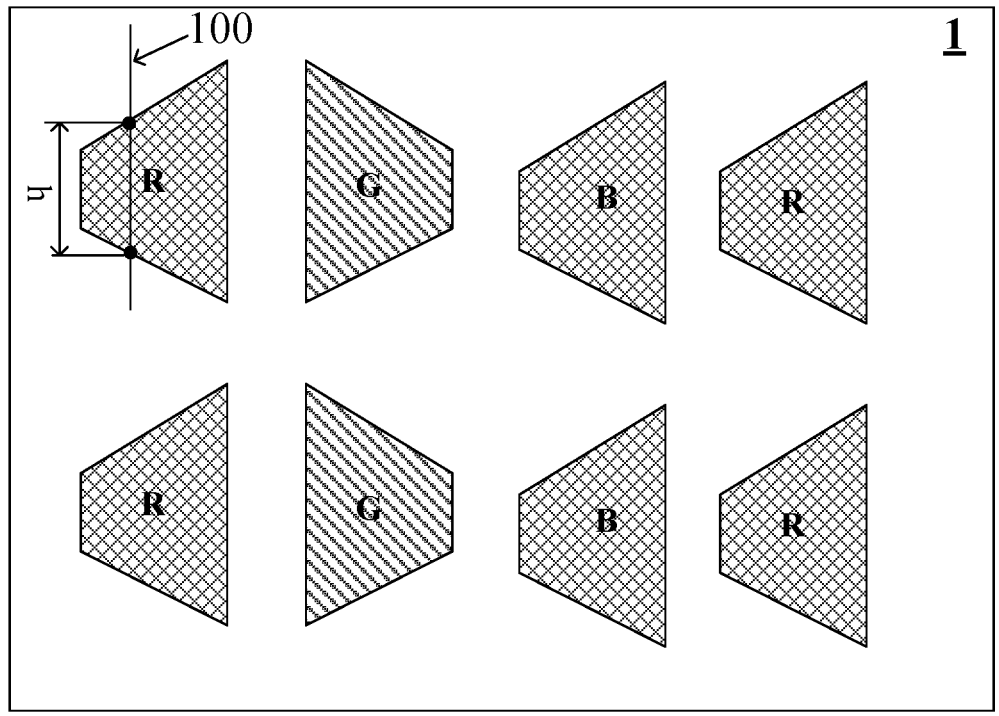
FIG. 2 is a schematic view showing a structure where sub-pixels are formed by a method according to an embodiment of the present disclosure.

Accordingly, as shown in FIG. 2, when the display substrate is manufactured according to this embodiment, irregular sub-electrodes R each corresponding to the red sub-pixel, sub-electrodes G each corresponding to the green sub-pixel, sub-electrodes B each corresponding to the blue sub-pixel are formed on the base substrate.

The sub-electrode R, sub-electrode G, and sub-electrode B differ from each other in shape. For example, in the case that a first line 100 extending in a first direction (e.g. the column direction in FIG. 2) moves in a second direction (e.g. the row direction in FIG. 2) perpendicular to the first direction within an area of each of the sub-electrodes R, G and B, the first line crosses each of the sub-electrodes with two crossing points, and a distance between two crossing points of the first line and the sub-electrode changes. Accordingly, the effective light-emitting area of each of the sub-pixels may be adjusted by adjusting the location of the pixel definition layer in the row direction.

In an optional embodiment, the sub-electrodes R, G, and B are of trapeziums, and each of two parallel sides of each of the trapeziums is parallel to the first direction, i.e. the column direction.

Figure 3:
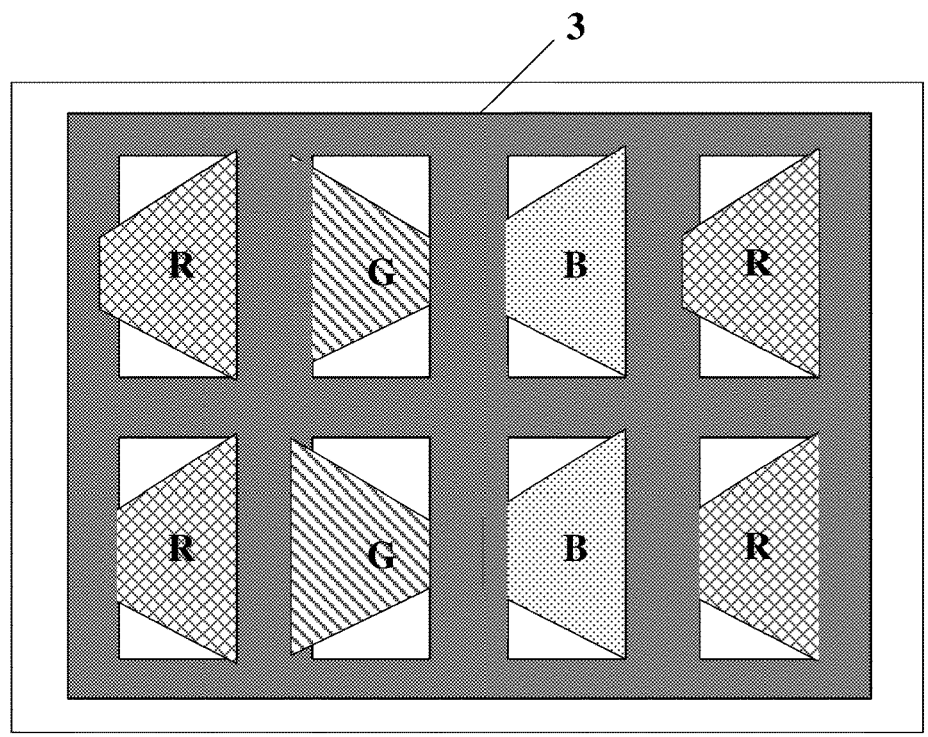
FIGS. 3 and 4 are schematic views showing adjustment of a pixel definition layer by a method according to an embodiment of the present disclosure.

As shown in FIG. 3, the pixel definition layer 3 with rectangular openings is arranged after an array of the sub-electrodes R, G, and B is formed on the base substrate. Considering the pixel definition layer 3 as shown in FIG. 3 is at its initial location. According to the pixel structure in FIG. 3, as shown in FIG. 4, the location of the pixel definition layer 3 may be adjusted in the first direction, i.e. the direction indicated by an arrow in FIG. 4.

Figure 4:
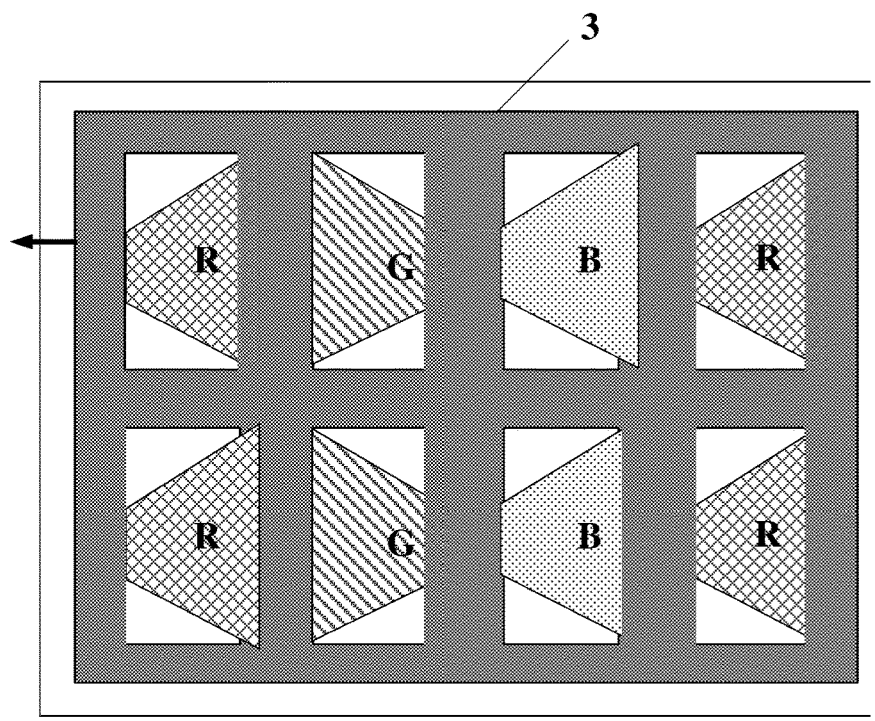

FIG. 4 shows the position of the pixel definition layer 3 after the adjustment. A comparison of FIGS. 3 and 4 shows that the effective light-emitting area of the green pixel is increased; and accordingly, the effective light-emitting areas of the red and blue pixels are decreased, because more areas of the sub-electrodes R and B are shaded by the pixel definition layer 3.

As a result, in the method according to this embodiment, and the effective light-emitting area of each of the sub-pixels may be adjusted as desired by adjusting the location of the pixel definition layer 3 appropriately.

It is worth noting that the shapes of the sub-electrodes corresponding to sub-pixels of different colors and the movement directions of the pixel definition layer may be suitably adjusted as needed.

In this embodiment, the location of the pixel definition layer 3 may be adjusted by moving towards the left, so as to increase the effective light-emitting area of the green color sub-pixel, and the sub-electrodes are of the shapes shown in FIG. 2, such that the distance "h" between two crossing points of the sub-electrode B and the first line becomes smaller and smaller, and distance "h" between two crossing points of the sub-electrode G and the first line becomes larger and larger, as the first line 100 moves from right to left. Accordingly, when the pixel definition layer moves towards the left, an overlapping area between the sub-electrode B and its corresponding opening becomes smaller and smaller, such that the effective light-emitting area of the blue sub-pixel becomes smaller and smaller, an overlapping area between the sub-electrode G and its corresponding opening becomes bigger and bigger. As a result, the effective light-emitting area of the blue sub-pixel is increased, and a ratio of effective light-emitting areas of different sub-pixels is also changed.

The method for manufacturing the display substrate in the embodiment has been described. It is worth noting that the above method is for illustration purpose only, the structure of the opening and the shape of the sub-electrode are not limited thereto, and can be of other polygons such as a triangle. Moreover, the above first direction is not limited to the column direction, may alternatively be a row direction; similarly, the second direction may alternatively be the column direction that is perpendicular to the row direction. Similarly, the sub-pixels are not limited to the colors of red, green, and blue. Moreover, in actual implementation, the location of the pixel definition layer may be determined by calculation in advance, and therefore the adjustment step may be omitted.

In addition, the adjustment is not limited to that shown in FIG. 3 and FIG. 4. Rather, all solutions in which effective light-emitting areas of the sub-pixels are controlled by adjusting the location of the pixel definition layer shall be within the scope of the present disclosure.

Therefore, according to the method in the embodiment, the shapes of the sub-electrodes may be adjusted in advance based on predetermined values of the effective light-emitting areas of the sub-pixels of different colors corresponding to the sub-electrodes. In the manufacturing process, the location of the pixel definition layer in the display substrate may be adjusted appropriately, to enable the effective light-emitting areas of various sub-pixels to satisfy the predetermined requirement.

In another aspect, the present disclosure further provides a display substrate manufactured according to the above method.

In this embodiment, the display substrate includes a first electrode and a second electrode formed on a base substrate, the display substrate is driven to display an image by an electric field generated between the first and second electrodes, the display substrate includes a plurality of sub-pixels, the first electrode includes a plurality of sub-electrodes corresponding to the plurality of sub-pixels respectively.

As shown in FIG. 1, the display substrate further includes: a pixel definition layer 3 arranged on the base substrate 1 on which the plurality of sub-electrodes 2 has been formed, wherein the pixel definition layer 3 is made of an opaque material, and includes light-transmissible openings 31 corresponding to the sub-electrodes 2 respectively, and an overlapping area between an orthogonal projection of each of the openings 31 on the base substrate 1 and an orthogonal projection of a sub-electrode 2 corresponding to the opening 31 on the base substrate is within a predetermined range. In the case that a first line extending in a first direction moves in a second direction within an area of each of the sub-electrodes 2, a distance between two crossing points of the first line and the sub-electrode 2 changes. The first direction is perpendicular to the second direction. As mentioned above, in this embodiment, an overlapping area between an orthogonal projection of the sub-electrode 2 on the base substrate and an orthogonal projection of the opening 31 corresponding to the sub-electrode on the base substrate is equal to the effective light-emitting area of the sub-pixel.

In particular, the sub-pixels are divided into groups of different colors; each of the sub-electrodes corresponding to the sub-pixels in one of the groups is of a shape different from a shape of each of the sub-electrodes corresponding to the sub-pixels in any other one of the groups; and the effective light-emitting area of each of the sub-pixels in one of the groups is of a predetermined requirement different from a predetermined requirement of each of the sub-pixels in any other one of the groups.

In particular, as shown in FIG. 2 and FIG. 3, the openings of the pixel definition layer 3 are the same in shape.

In this embodiment, the sub-electrode 2 is a trapezium in shape, and each of two parallel sides thereof is parallel to the first direction.

In this embodiment, the display substrate is manufactured according to the above method, and therefore may have similar technical effect as the above method.

In practice, the display substrate of the embodiment may be applicable to any one of suitable display panels, such as a RGB (Red Green Blue) OLED (Organic Light-Emitting Diode) top/bottom-emitting display panel, an OLED and COA (Color filter On Array) bottom-emitting display panel, and a WOLED (White Organic Light-Emitting Diode) and CF (Color Filter) display panel.

Moreover, the present disclosure further provides a display device including the above display substrate. According to the display substrate of the present disclosure, the effective light-emitting areas of the pixels of different colors in the display device may be optimized, so as to improve the display quality.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A method for manufacturing a display substrate, wherein the display substrate comprises a first electrode formed on a base substrate, the display substrate comprises a plurality of sub-pixels, the first electrode comprises a plurality of sub-electrodes corresponding to the plurality of sub-pixels respectively, wherein the display substrate further comprises: a pixel definition layer arranged on the base substrate on which the plurality of sub-electrodes has been formed, wherein the pixel definition layer is made of an opaque material, and comprises light-transmissible openings corresponding to the sub-electrodes respectively, and an overlapping area between an orthogonal projection of each of the openings on the base substrate and an orthogonal projection of a sub-electrode corresponding to the opening on the base substrate is within a predetermined range, wherein a distance between two crossing points of a first line and each sub-electrode changes when the first line extending in a first direction moves in a second direction within an area of each of the sub-electrodes, the first direction is perpendicular to the second direction, the overlapping area is an effective light-emitting area of each sub-pixel corresponding to a respective sub-electrode, the openings of the pixel definition layer are of an identical shape, each of the openings is a rectangle, each of two opposite sides of the rectangle is parallel to the first direction, the sub-electrodes are trapeziums, and each of two parallel sides of each of the trapeziums is parallel to the first direction, wherein the method comprises:

determining a predetermined requirement of the effective light-emitting area of each sub-pixel; and forming the pixel definition layer on the base substrate on which the plurality of sub-electrodes has been formed, wherein a location of the pixel definition layer on the display substrate is controlled in the second direction, to control the overlapping area between the orthogonal projection of each of the openings on the base substrate and the orthogonal projection of the sub-electrode corresponding to the opening on the base substrate to be within a predetermined range, and the effective light-emitting area of the sub-pixel is enabled to satisfy the predetermined requirement by the overlapping area being the effective light-emitting area of the sub-pixel corresponding to the sub-electrode.

2. The method according to claim 1, wherein
the sub-pixels are divided into groups of different colors;
each of the sub-electrodes corresponding to the sub-pixels in one of the groups is of a shape different from a shape of each of the sub-electrodes corresponding to the sub-pixels in any other one of the groups; and
the effective light-emitting area of each of the sub-pixels in one of the groups is of a predetermined requirement different from a predetermined requirement of each of the sub-pixels in any other one of the groups.

3. The method according to claim 2, wherein the groups comprise a group of red sub-pixels, a group of green sub-pixels, and a group of blue sub-pixels.

4. The method according to claim 2, wherein determining the predetermined requirement of the effective light-emitting area of each of the sub-pixels comprises:
determining a ratio of the effective light-emitting area of each of the sub-pixels in one of the groups to the effective light-emitting area of each of the sub-pixels in any other one of the groups by a color compensation algorithm.

5. The method according to claim 1, wherein:
the first direction is a row direction of the display substrate, and the second direction is a column direction of the display substrate; or
the first direction is the column direction of the display substrate, and the second direction is the row direction of the display substrate.

6. The method according to claim 2, wherein:
the first direction is a row direction of the display substrate, and the second direction is a column direction of the display substrate; or
the first direction is the column direction of the display substrate, and the second direction is the row direction of the display substrate.

7. A display substrate, comprising a first electrode formed on a base substrate, the display substrate comprising a plurality of sub-pixels, the first electrode comprising a plurality of sub-electrodes corresponding to the plurality of sub-pixels respectively, wherein the display substrate further comprises:
a pixel definition layer arranged on the base substrate on which the plurality of sub-electrodes has been formed, wherein the pixel definition layer is made of an opaque material, and comprises light-transmissible openings corresponding to the sub-electrodes respectively, and an overlapping area between an orthogonal projection of each of the openings on the base substrate and an orthogonal projection of a sub-electrode corresponding to the opening on the base substrate is within a predetermined range, wherein a distance between two crossing points of a first line and each sub-electrode changes when the first line extending in a first direction moves in a second direction within an area of each of the sub-electrodes, the first direction is perpendicular to the second direction, the overlapping area is an effective light-emitting area of each sub-pixel corresponding to a respective sub-electrode, the openings of the pixel definition layer are of an identical shape, each of the openings is a rectangle, each of two opposite sides of the rectangle is parallel to the first direction, the sub-electrodes are trapeziums, and each of two parallel sides of each of the trapeziums is parallel to the first direction.

8. The display substrate according to claim 7, wherein the sub-pixels are divided into groups of different colors;

each of the sub-electrodes corresponding to the sub-pixels in one of the groups is of a shape different from a shape of each of the sub-electrodes corresponding to the sub-pixels in any other one of the groups; and the effective light-emitting area of each of the sub-pixels in one of the groups is of a predetermined requirement different from a predetermined requirement of each of the sub-pixels in any other one of the groups.

9. The display substrate according to claim 8, wherein the groups comprise a group of red sub-pixels, a group of green sub-pixels, and a group of blue sub-pixels.

10. The display substrate according to claim 7, wherein:
the first direction is a row direction of the display substrate, and the second direction is a column direction of the display substrate; or
the first direction is the column direction of the display substrate, and the second direction is the row direction of the display substrate.

11. A display device, comprising the display substrate according to claim 7.

12. The display device according to claim 11, wherein the sub-pixels are divided into groups of different colors;

each of the sub-electrodes corresponding to the sub-pixels in one of the groups is of a shape different from a shape of each of the sub-electrodes corresponding to the sub-pixels in any other one of the groups; and the effective light-emitting area of each of the sub-pixels in one of the groups is of a predetermined requirement different from a predetermined requirement of each of the sub-pixels in any other one of the groups.

13. The display device according to claim 12, wherein the groups comprise a group of red sub-pixels, a group of green sub-pixels, and a group of blue sub-pixels.

14. The display device according to claim 11, wherein:
the first direction is a row direction of the display substrate, and the second direction is a column direction of the display substrate; or
the first direction is the column direction of the display substrate, and the second direction is the row direction of the display substrate.

* * * * *